United States Patent [19]
Burns et al.

[11] Patent Number: 5,936,537
[45] Date of Patent: Aug. 10, 1999

[54] HIGH FREQUENCY SIGNAL DETECTOR

[75] Inventors: Lawrence M. Burns, Mountain View; Daniel Case, San Jose; David A. Fisher, Menlo Park, all of Calif.

[73] Assignee: 3Com Corporation, Santa Clara, Calif.

[21] Appl. No.: 08/716,763

[22] Filed: Sep. 23, 1996

[51] Int. Cl.⁶ .................................................. G08B 21/00
[52] U.S. Cl. ......................... 340/664; 324/627; 340/661
[58] Field of Search .............................. 340/664, 310.08, 340/661, 825.55; 324/627

[56] References Cited

U.S. PATENT DOCUMENTS

| | | | |
|---|---|---|---|
| 3,686,531 | 8/1972 | Decker et al. | 340/664 |
| 4,135,152 | 1/1979 | Stuchly et al. | 324/627 |
| 4,471,355 | 9/1984 | Hardy et al. | 340/664 |
| 4,983,955 | 1/1991 | Ham, Jr. et al. | 340/661 |
| 5,267,231 | 11/1993 | Dzieduszko | 340/664 |
| 5,552,715 | 9/1996 | Rogers | 324/627 |
| 5,561,605 | 10/1996 | Zuercher et al. | 340/661 |

*Primary Examiner*—Daniel J. Wu
*Assistant Examiner*—John Tweel, Jr.
*Attorney, Agent, or Firm*—Kent R. Richardson; Wilson, Sonsini, Goodrich & Rosati

[57] ABSTRACT

A micro-power, micro-size RF detector is suitable for implementation on an integrated circuit. The detector is used for detecting the presence of high frequency AC signals on a transmission line which has a transmission line impedance. An input for connection to the transmission line through a high impedance relative to the transmission line is provided. A current mode detector is coupled to the input. The current mode detector translates AC signals on the input to a bias signal having a DC component determined by power of the AC signal on the transmission line. A current mode amplifier is coupled to the current mode detector, and amplifies the bias signal to produce a detector current. A binary output driver is coupled to the current mode amplifier, which generates a binary signal having one binary level if the detector current exceeds a high signal threshold, and another binary level if the detector current falls below a low signal threshold.

25 Claims, 8 Drawing Sheets

HIGH FREQUENCY SIGNAL DETECTOR

BACKGROUND OF THE INVENTION

1. Field of the Invention

The present invention relates to circuits used for testing high frequency electrical systems, such as radio frequency RF transmitters and receivers; and more particularly to circuits used for detecting the presence of alternating current AC signals at test points in such circuits.

2. Description of Related Art

In a manufacturing environment, a means by which RF components can be quickly tested to determine whether the RF signal has reached the component is of significant value. A circuit which provides this test allows technicians with no RF experience and no special test equipment to perform testing quickly and cheaply. Ideally, such an RF sensing circuit would have a digital output that indicates the presence of RF energy at its input. This digital output could then be connected with high speed automated test equipment for hands off testing.

FIG. 1 illustrates one prior art AC signal detector which is useful at RF frequencies. The test point 10 is connected in the circuit of FIG. 1 through a DC blocking capacitor 11, which passes the AC signal from the test point line 10 to the point 12. A diode 13 is used to half wave rectify the incoming signal at node 12. The rectified signal is passed through an LC filter comprising inductor 14 and capacitor 15. The output of the filter is a DC voltage at node 16 which is supplied to the input of a finite gain amplifier 17. A resistor 18 is connected from node 16 to the supply potential to provide a load on the circuit. A reference circuit is provided with resistor 20 and diode 21 connected in series. The node between the diode 21 and the resistor 20 is connected to the negative input of the amplifier 17. The amplifier 17 produces an output proportional to the RF signal level at the input 10. In some versions of this circuit, the amplifier 17 can be replaced with a voltage comparator whose output goes high when the RF signal exceeds a pre-determined level above the reference voltage, and thereby provides a digital output. One problem with the circuit of FIG. 1 is that it requires a relatively large inductor 14. This makes the circuit impractical for use in an integrated circuit environment. Also, the low impedance input 10 unduly loads the circuit being tested, unless isolation circuits like directional couplers are used. Even with directional couplers, the input to the detector would be substantially reduced in magnitude, limiting the sensitivity of the detector.

FIG. 2 illustrates an alternative approach to RF detection. The circuit in FIG. 2 is referred to as bolometer detector. An RF input at node 30 is connected across a transmission line 31 having a characteristic impedance of for example 50 ohms. A detection resistor 32 is coupled to the transmission line 31. As the current in the resistor 32 increases, its temperature increases. A temperature-to-voltage converter 33 is coupled with the resistor 32 and generates an output that is connected to amplifier 34. A reference circuit is provided by resistor 35 which is connected to ground on both ends. The temperature of the resistor 35 is converted to a voltage by converter 36. The output of the converter 36 is connected to the amplifier 34. The amplifier 34 generates an output on line 37 that measures the root mean square RMS power of the RF signal on the input 30. As with the circuit of FIG. 1, the amplifier 34 could be replaced with a comparator that provides a digital output on line 37.

The bolometer detector is an excellent RF signal detector. However, it suffers the disadvantage that it loads the input 30 significantly. Thus, for very small signals, the bolometer detector has too much impact on the circuit being tested to provide useful results.

Accordingly, it is desirable to provide an RF detector circuit which presents a high impedance to the circuit under test over a broad range of frequencies, and minimally loads the circuit. Furthermore, it is desirable that the detector be AC coupled to the circuit under test so as not to upset or change the bias conditions of the circuit. Furthermore, such detectors should be physically small, and suitable for implementation on an integrated circuit so that the cost of the detector is minimized and the detector takes up very little board space on the circuit being tested. In addition, the detector should be low cost, and consume very little power in the circuit under test or in the circuit which carries the detector.

SUMMARY OF THE INVENTION

The present invention provides a micro-power, micro-size RF detector suitable for implementation on an integrated circuit. The detector according to the present invention is used for detecting the presence of AC signals on a transmission line which has a transmission line impedance. An input for connection to the transmission line through a high impedance relative to the impedance of the transmission line is provided. A current mode detector is coupled to the input. The current mode detector translates AC signals on the input to a bias signal having a DC component determined by power of the AC signal on the transmission line. A current mode amplifier is coupled to the current mode detector, and amplifies the bias signal to produce a detector current. A binary output driver is coupled to the current mode amplifier, which generates a binary signal having one binary level if the detector current exceeds a high signal threshold, and another binary level if the detector current falls below a low signal threshold. In one embodiment, the high and low signal thresholds are about the same. In another embodiment, the high and low signal thresholds are different so that hysteresis is established in the circuit.

The detector according to the present invention operates over a frequency range from as low as 100 MHz to over 2.5 gigahertz. Preferably, the detector operates from near 10 MHz to over 2.5 gigahertz. In another embodiment of the invention, the range over which the detector is operable goes from about 100 MHz to 10 gigahertz or more.

According to one aspect of the present invention, the current mode detector comprises an input current mirror. The input current mirror has a diode connected transistor having a bias terminal (base or gate), a current input terminal (collector or drain), and a current output terminal (emitter or source). The bias terminal is coupled to the detector input and to the current input terminal of the transistor. The current input terminal is coupled to a constant current source. The current output terminal is coupled to a reference potential. Thus current in the diode connected transistor is modulated by the AC signal on the input. A mirror connected transistor having a bias terminal, a current input terminal and a current output terminal is coupled with the diode connected transistor of the input current mirror circuit. The bias terminal of the mirror connected transistor is coupled to the bias terminal of the diode connected transistor. The current input terminal of the mirror connected transistor is coupled to a non-linear load. The current output terminal of the mirror connected transistor is coupled to the reference potential so that the current in the diode connected transistor is mirrored in the mirror connected transistor. A current mode rectifying circuit is coupled to the input current mirror circuit, and rectifies the current in the current mirror circuit to produce the bias signal.

According to one aspect of the invention, the current mode rectifying circuit comprises a reference current mirror circuit having a diode connected transistor and a mirror connected transistor. The diode connected transistor has a bias terminal coupled to the current input terminal of the diode connected transistor, a current input terminal coupled to a constant current source, and a current output terminal coupled to a reference potential, so that current in the diode connected transistor is substantially constant. The mirror connected transistor has a bias terminal coupled to the bias terminal of the diode connected transistor of the reference current mirror circuit, a current input terminal coupled to a non-linear load which matches the nonlinear load of the input current mirror circuit, and a current output terminal coupled to the reference potential so that current in the diode connected transistor is mirrored in the mirror connected transistor of the reference current mirror circuit.

A first differential pair of transistors and a second differential pair of transistors are used to rectify the bias signal. The first differential pair of transistors have current output terminals connected in common to a current source transistor, which is connected to mirror the current in the mirror connected transistor of the input current mirror circuit. A bias terminal on the first transistor in the first differential pair is coupled to the current input terminal of the current mirror connected transistor of the input current mirror circuit. The bias terminal on a second transistor in the first differential pair is coupled to the current input terminal of the mirror connected transistor of the reference current mirror circuit. A current input terminal on the first transistor of the first differential pair is connected to a first rectified output node. The current input terminal of the second transistor of the first differential pair is connected to a second rectified output node.

The second differential pair of transistors in the current mode rectifying circuit according to this aspect of the invention, includes a first and a second transistor having current output terminals connected in common to a current source transistor that is connected to mirror current in the mirror connected transistor of the reference current mirror circuit. A bias terminal on the first transistor in the second differential pair is coupled to the current input terminal of the mirror connected transistor of the input current mirror circuit. A bias terminal on the second transistor in the second differential pair is coupled to the current input terminal of the mirror connected transistor of the reference current mirror circuit. A current input terminal on the first transistor of the second differential pair is connected to the second rectified output node. A current input terminal on the second transistor of the second differential pair is connected to the first rectified output node. The cross coupling of the output nodes of the first and second differential pairs provides a full rectifying action for the current mode rectifying circuit.

Also according to this aspect of the present invention, the current mode amplifier in the detector circuit comprises a current differencing circuit having inputs which are coupled to the first and second rectified outputs of the first and second differential pairs of transistors in the current mode rectifying circuit. The binary output driver comprises an open collector (or open drain) driver, which is responsive to a difference between current on the first and second rectified outputs to provide the binary output signal indicating the presence or not of an AC signal on the input to the detector circuit.

In a preferred system, the transistors in the detector comprise bipolar transistors in which the bias terminal corresponds to the base, the current output terminal corresponds to a collector and the current input terminal corresponds to an emitter. Alternative systems are based on CMOS transistors, in which the bias terminal corresponds to a gate, the current input terminal corresponds to a drain, and the current output terminal corresponds to a source.

According to an alternative embodiment of the present invention, the current mode detector comprises a diode connected transistor having a bias terminal, a current input terminal and a current output terminal. The bias terminal is coupled to the current input terminal and to the signal input. The current input terminal is coupled to a constant current source. A current output terminal is coupled to a reference potential, so that current due to the AC signal on the bias terminal of the diode connected transistor is rectified. A filter comprising a resistor and a capacitor is coupled to the bias terminal of the diode connected transistor. The resistor has one terminal coupled to the bias terminal of the diode connected transistor, and a second terminal connected to a first terminal of the capacitor. The second terminal of the capacitor is connected to a reference potential. Current on the bias terminal of the diode connected transistor is averaged at the first terminal of the capacitor. According to this aspect of the invention, the current mode amplifier comprises a transistor having a bias terminal, a current input terminal and a current output terminal. The bias terminal is coupled to the first terminal of the capacitor. The current output terminal is coupled to a constant current source which matches the constant current source coupled to the current output terminal of the diode connected transistor. The current input terminal is coupled to the reference potential so that current in the transistor is modulated in response to power of the AC signal, as represented by the averaged signal at the first terminal of the capacitor in the filter of the current mode detector. The output driver according to this aspect of the invention comprises an open collector driver, which is responsive to current on the current output terminal of the transistor in the current mode amplifier.

According to another aspect of the present invention, the current mode detector, the current mode amplifier, and a binary output driver comprise elements of a single integrated circuit. More particularly, these elements are implemented on a single integrated circuit having four input/output pins, one for power, one for ground, one for the AC signal input, and one for the binary output. This results in a very compact test point circuit which can be mounted on a printed wiring board of an RF transmitter and receiver, or other high frequency electronic circuit, in which testing of the circuit for the presence of high frequency AC or RF signals is useful.

The present invention can also be characterized as an apparatus for testing a RF circuit which has a plurality of test points at which RF signals are present during normal operation. The apparatus comprises a plurality of integrated circuit RF detectors, with one integrated circuit RF detector coupled to a corresponding test point in the plurality of test points. The integrated circuit RF detector comprises the elements discussed above. With use of the open collector (or open drain) output driver, a plurality of integrated circuit RF detectors can be coupled to a single test terminal on the printed wiring board on which the RF circuit is mounted. A common pull-up can be utilized for testing separate sections of the RF circuit independently. For instance, test points on transmitter elements of a RF circuit can be tested using the plurality of test terminals while test points in the receive portion of the RF circuit are powered down. To test the receive portion, the transmit portion is powered down, and testing of the receive portion proceeds using the same plurality of test terminals as was used with the transmit portion. Thus, more than one integrated circuit RF detector has an output coupled to a single test terminal in this embodiment.

Furthermore, the plurality of integrated circuit RF detectors is mounted on the same printed wiring board as the RF circuit under test. This way, the low cost compact integrated circuit RF detectors can be permanently mounted with the circuit, and carried with the circuit in commercial embodiments, greatly facilitating the manufacturing and testing of the circuit. In alternative systems, the integrated circuit RF detectors are mounted on a test fixture which is adapted to couple with the printed wiring board on which the RF circuit is mounted.

Accordingly, the present invention provides a micro power, micro size RF detector circuit which presents a high impedance to the circuit under test over a broad range of frequencies, and which is AC coupled to the circuit under test so as not to upset or change the bias conditions of the circuit under test. Furthermore, the manufacturing cost of the detector is very small and it takes up very little board space. Finally, the detector consumes very little power, and efficiently presents test signals useful in the manufacturing and testing of RF circuits, such as transmitters and receivers.

Other aspects and advantages of the present invention can be seen upon review of the figures, the detailed description and the claims which follow.

DETAILED DESCRIPTION

Figures 1, 2:
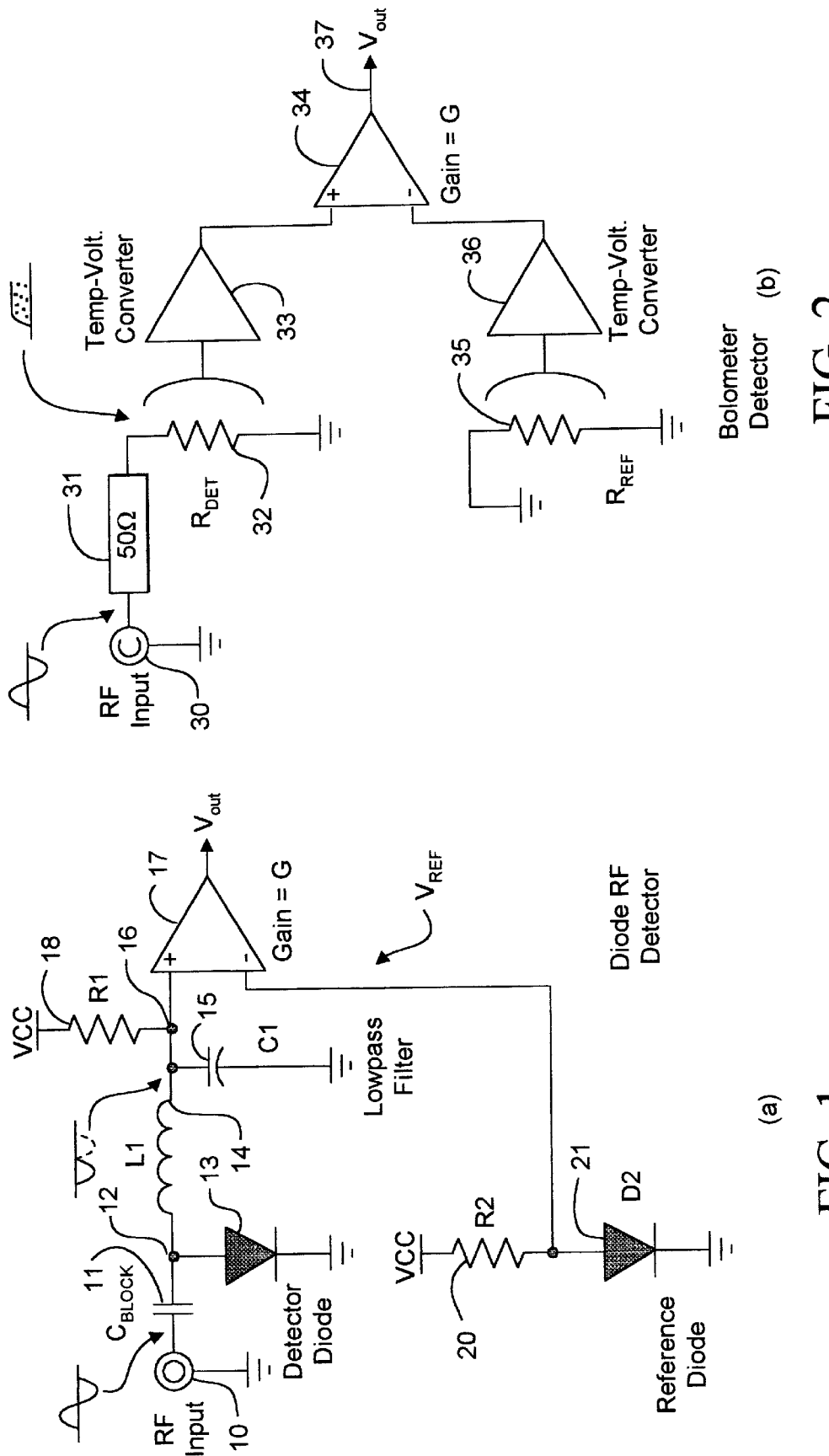
FIG. 1 is a schematic diagram of a prior art RF detector.
FIG. 2 is a schematic diagram of an alternative prior art RF detector.
Figure 3:
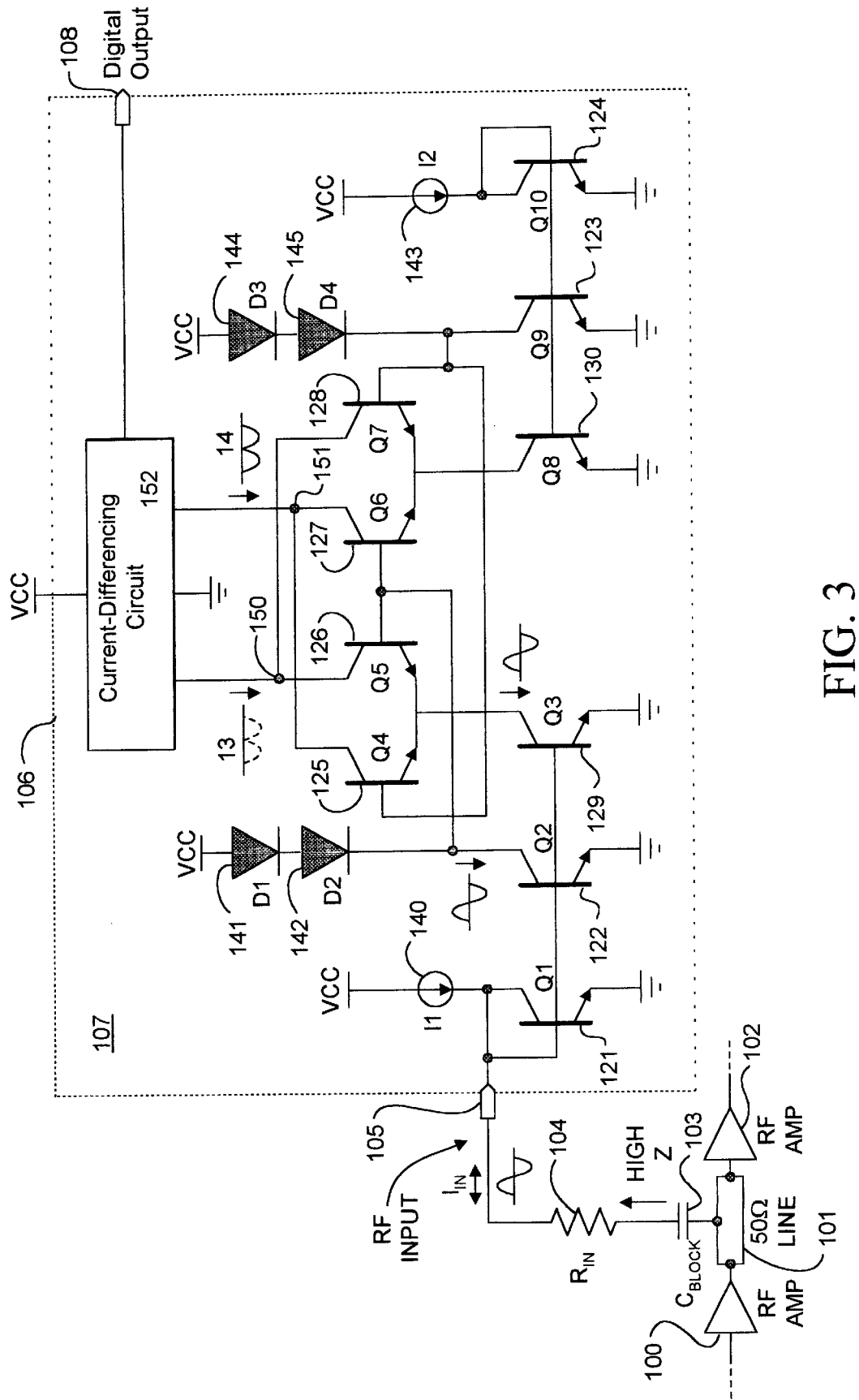
FIG. 3 is a schematic diagram of a first embodiment of an RF detector according to the present invention.

A detailed description of preferred embodiments of the present invention is provided with respect to FIGS. 3–9. FIG. 3 provides an overall simplified diagram of a first embodiment of the RF detector according to the present invention. A circuit under test includes a RF amplifier 100, a transmission line 101, and a RF amplifier 102. A DC blocking capacitor 103 and a load resistor 104 are connected in series (on or off chip), between the transmission line 101, and a RF input 105 of the detector circuit 106. The impedance presented by the 104 resistor is high relative to the impedance of the transmission line 101. For example, with a 50 Ohm transmission line 101, the impedance of resistor 104 is about 500 Ohms or 1000 Ohms. The RF detector 106 includes a RF input 105, a current mode detector circuit 107, and a current differencing circuit 152. Also included in the detector 106 according to the preferred embodiment is a binary output driver (not shown in FIG. 3), which drives the digital output 108.

The current mode detector 107 includes an input current mirror circuit comprising transistors 121 and 122, and a rectifying circuit comprising a reference current mirror circuit comprising transistors 123 and 124, and a rectifying circuit comprising two differential pairs of transistors including the pair of transistors 125 and 126, and the pair of transistors 127 and 128. The first differential pair of transistors 125 and 126 is supplied by current source transistor 129. The second differential pair of transistors 127 and 128 is supplied by current source transistor 130.

The input current mirror circuit includes diode connected transistor 121 and transistor 122. Transistor 121 has its base connected to its collector, and its emitter connected to ground. Also the collector of transistor 121 is connected to a constant current source 140. Finally, the base of transistor 121 is connected to the input 105, so that the current through transistor 121 is modulated by the AC signal on the input 105.

Transistor 122 has its base connected to the base of transistor 121, and its emitter connected to ground. The collector of transistor 122 is connected to a non-linear load comprising diodes 141 and 142 connected in series between the supply potential VCC, and the collector of transistor 122. This generates a signal at the collector of transistor 122 which is modulated by the signal on the input 105.

The balance of the transistors in the current mode detector 107 operate as a full wave rectifying circuit. A reference current mirror circuit comprising transistors 124 and 123 generates a reference signal at the collector of transistor 123. The transistor 124 has its base connected to its collector, and its collector connected to a constant current source 143 which matches the constant current source 140. The transistor 123 has its base connected to the base of transistor 124, and its emitter connected to ground. The collector of transistor 123 is connected to a non-linear load comprising diodes 144 and 145 connected in series between the supply potential VCC and the collector of transistor 123. The diodes 144 and 145 match the diodes 141 and 142. The collector of transistor 122 on the input current mirror circuit and the collector of transistor 123 on the reference current mirror circuit are used to control the first and second differential pairs of transistors. Thus, the first differential pair of transistors includes transistors 125 and 126 which have their emitters connected in common to the current source transistor 129. Current source transistor 129 has its base connected to the base of transistor 121, its emitter connected to ground, and its collector connected to the common emitter node of transistors 125 and 126. The base of transistor 126 is connected to the collector of transistor 122 in the input current mirror circuit. The base of transistor 125 is connected to the collector of transistor 123 in the reference current mirror circuit.

The second differential pair of transistors 127 and 128 have their emitters connected in common to the collector of current source transistor 130. Transistor 130 has its base connected to the base of transistor 124 and its emitter connected to ground. The base of transistor 127 is connected to the collector of transistor 122 and the base of transistor 128 is connected to the collector of transistor 123.

The collectors of the first and second differential pairs are cross coupled to nodes 150 and 151 in order to produce a full wave rectified signal for supply to the current differencing circuit 152. Thus, the collectors of transistors 126 and 128 are connected to node 150. The collectors of transistors 125 and 127 are connected to the node 151. A full wave rectified signal at node 151 comprises a current having a DC component which is determined by the power of the RF input. The current differencing circuit 152 comprises a current mode amplifier which amplifies the signal at node 151 to produce a detector current. Also included in the differencing circuit 152 is a binary output driver which drives the digital output 108.

Figure 4:
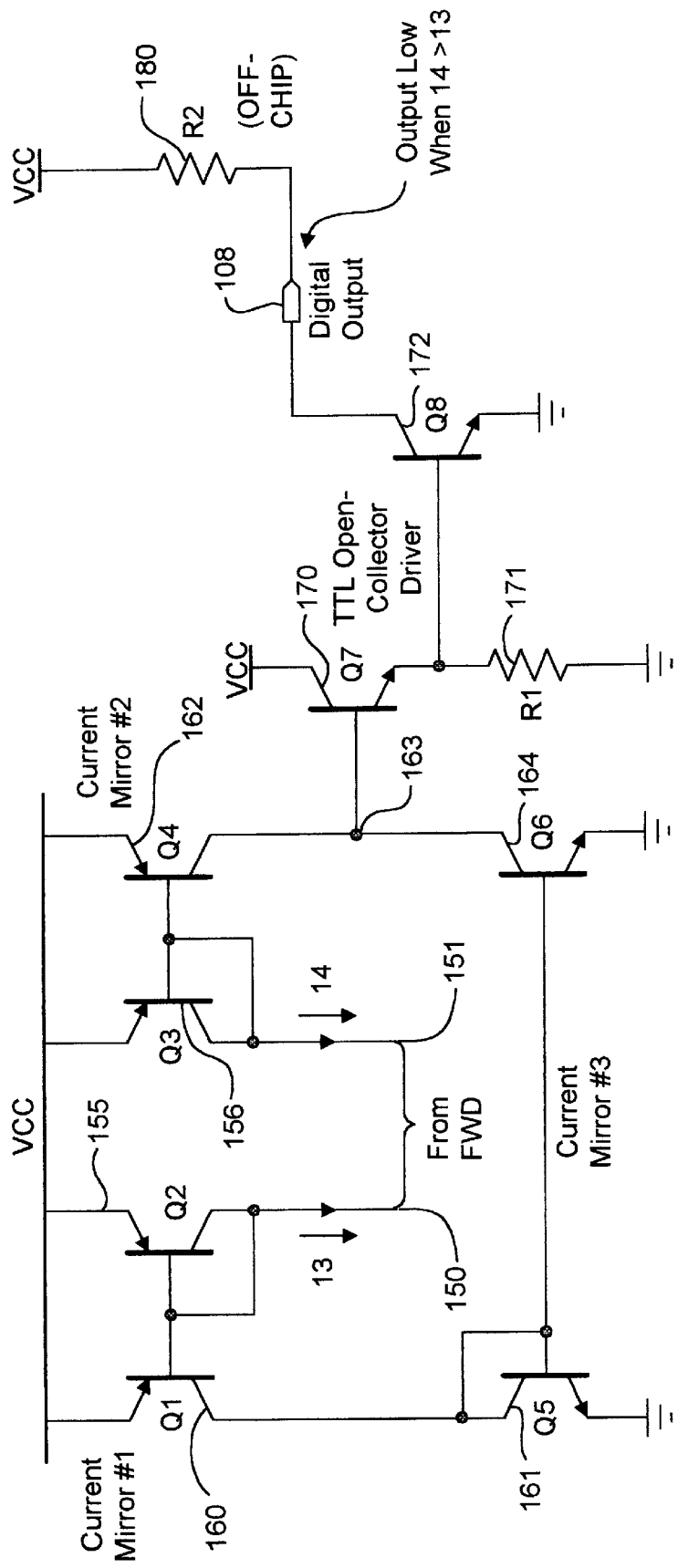
FIG. 4 is a simplified schematic diagram of a current differencing circuit and TTL output driver used in the circuit of FIG. 3.

FIG. 4 is a simplified diagram of the current differencing circuit and binary output driver circuit for use with circuit of FIG. 3. The current differencing circuit includes a first current input at node 150 and a second current input at node 151. Node 150 is connected to the collector and base of PNP transistor 155. The emitter of transistor 155 is connected to the supply potential VCC. Node 151 is connected to the collector and base of PNP transistor 156. The emitter of transistor 156 is connected to the supply potential VCC.

PNP transistor 160 is connected in current mirror fashion with transistor 155, having its base connected to the base of transistor 155, its emitter connected to the supply potential, and its collector coupled to a NPN load transistor 161. The load transistor has its collector and base connected in common, and its emitter connected to ground.

In a similar fashion, transistor 156 is coupled with current mirror PNP transistor 162. The current mirror transistor 162 has its base connected to the base of transistor 156, its emitter connected to the supply potential VCC, and its collector connected to node 163. Also, a NPN load transistor 164 has its collector connected to node 163, its emitter connected to ground, and its base connected to the base of transistor 161.

The node 163 carries a current mode detector output current which increases as the power of the RF input signal, and flows into the base of transistor 170 to turn it on.

The node 163 is also connected to a binary output driver which is connected to first transistor 170 having its collector connected to the supply potential, its base connected to node 163, and its emitter connected across a load resistor 171 to ground. Also the emitter of transistor 170 is connected to the base of transistor 172 in a Darlington configuration. The emitter of transistor 172 is connected to ground, the collector of transistor 172 is an open collector output for the digital output node 108. An off chip load resistor 180 operates as a pull-up load for the open collector output. When a RF signal is detected, transistor 172 is turned on, pulling down node 108. When no signal is detected, transistor 172 is off and node 108 is pulled up to the supply potential.

With reference to FIGS. 3 and 4, operation of the circuit can be understood. When no RF signal is present on the transmission line 101, and if the reference currents 140 and 143 are equal, then the currents through transistors 121, 122 and 129, and transistors 123, 124 and 130 are equal. This means that the voltages at the bases of transistors 125, 126, 127 and 128 are the same. The currents produced by these differential pairs are then split equally, so that the current at node 150 and the current at node 151 are equal.

The presence of a RF signal on the transmission line 101 will cause a fluctuation of the RF input 105. This forces a small current either into or out of transistor 121 which is diode connected. Due to the current mirror action, whatever current is flowing in transistor 121 is mirrored in transistors 122 and 129. For example, if current is forced into the detector circuit during a positive half of the RF waveform, then the current in transistors 122 and 129 increases during the positive half of the input signal. An increase in current at transistor 122 causes the current in diodes 141 and 142 to increase and the voltage on the bases of transistors 126 and 127 to drop. Since the collector current of transistor 129 is also increased, transistor 125 has the most current during the positive half cycle of the RF input signal. On the other hand, if current is drawn out of the RF input during the negative half cycle, the current on transistors 122 and 129 will be lower and the voltage on the bases of transistors 126 and 127 higher. This means that transistor 127 will now have the most current. This results in the current on node 151 being greater than the current on node 150 on both the positive and negative half of the RF input signal due to the cross coupled arrangement of the differential pairs of transistors. The current differencing circuit 152 is designed to produce a logic low output whenever the time averaged current at node 151 exceeds the current at node 150 by some specified amount.

Resistors could be used in place of the diodes 141, 142, 144 and 145. However, because the currents in the detector are on the order of 50 micro amps or less, relatively large valued resistors would be needed. This also creates an unwanted AC roll-off due to parasitic input capacitance of the transistors in the differential pairs, and the capacitance on the collector of transistor 122. The roll-off desensitizes the circuit at high frequencies. Thus, the diodes are utilized as loads for transistors 122 and 123, creating a low impedance load at the collector of transistor 122 and maintaining the gain of the circuit up to much higher frequencies, such as high as 2.5 gigahertz, 4 gigahertz, or more. The diodes are also physically smaller, saving chip area.

The current differencing circuit in FIG. 4 operates based on the current mirror function. If the currents at nodes 150 and 151 are equal, then the action of the two current mirrors based on transistors 155 and 160, and 156 and 162, respectively, is such that the current into the base of transistor 170 is zero. When the current at node 151 is greater than the current at node 150, the current is forced into the base of transistor 170. Thus, whenever there is a RF signal present at the input of the detector, current is forced into the base of transistor 170 turning it on. Transistor 170 in turn is connected in a Darlington configuration with transistor 172. Transistor 172 provides the open collector digital output at node 108, in an "active low" configuration in this example. A low pass filtering of the full wave rectified detected RF signal at nodes 150 and 151 is provided by using slow lateral PNP transistors in the current mirror circuit (155, 156, 160, 162). Capacitance can be added to the circuit to provide greater filtering action.

Figure 5:
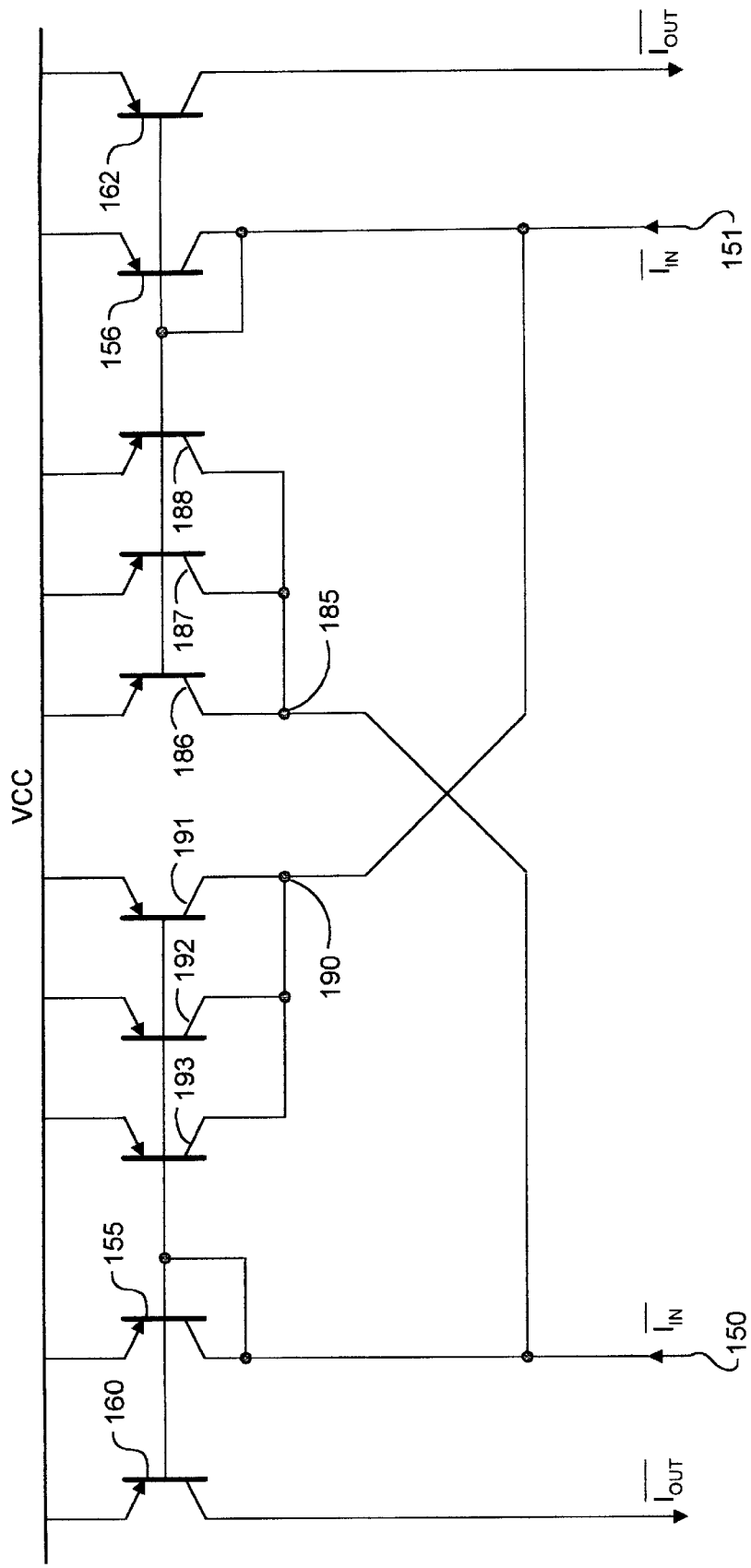
FIG. 5 is a schematic diagram of a current mirror implementing hysteresis for use in the current differencing circuit of FIG. 4.

FIG. 5 illustrates a technique for adding hysteresis to the current differencing circuit which might be useful in some testing environments. In particular, the transistors 155 and 160, in the transistors 156 and 162 are illustrated in the figure coupled to the input nodes 150 and 151. Hysteresis is added by providing a cross coupling of current by connecting the common collector node 185 of transistors 186, 187 and 188 to node 150, and the emitter of such transistors to the supply potential. The base of transistors 186–188 is connected to the base of transistor 156. The common collector node 190 of transistors 191, 192 and 193 is coupled to node 151. The base of transistors 191–193 is connected to the base of transistor 155, and the emitter of transistors 191–193 is connected to the supply potential VCC. This cross coupling adds hysteresis to the current differencing circuit so that the turn-on threshold of the binary output driver is higher than the turn-off threshold. A digital hysteresis provides a sharper output transition, regardless of the RF input level and better control of threshold effects independent of process, temperature and power supply level. The hysteresis provides noise immunity and prevents undefined logic outputs.

Figure 6:
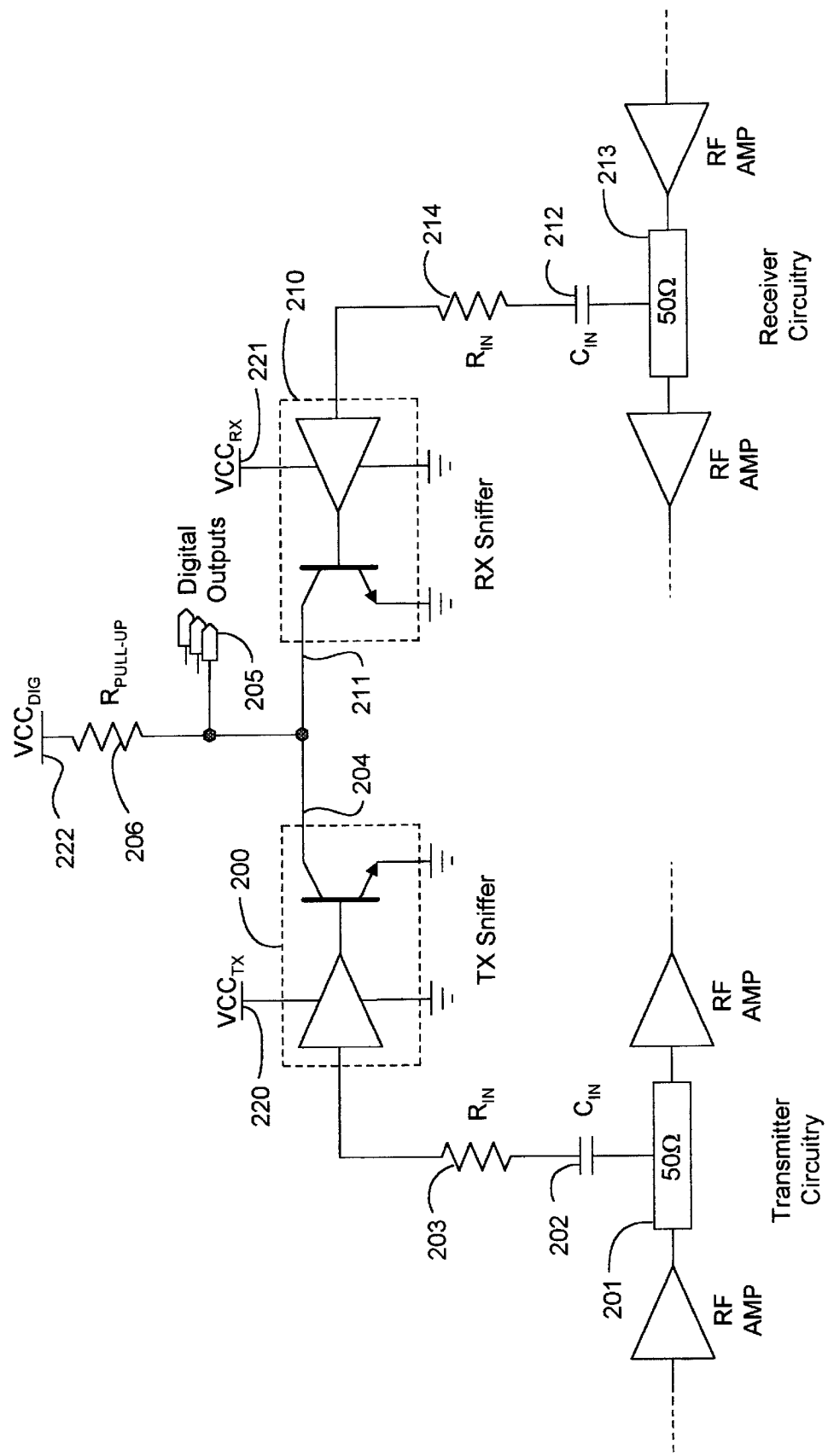
FIG. 6 is a diagram illustrating the use of open collector outputs which allow wired OR connections of the RF detectors of the present invention.

FIG. 6 illustrates the wired OR configuration of RF detectors according to the present invention which is possible because of the open collector output. Thus, as shown in FIG. 6 a first detector circuit 200 is connected to a test point 201 on a transmission line in a transmitter section of a RF circuit. An input capacitor 202 and a load resistor 203 are connected in series between the transmission line 201 and the detector 200. The output of the detector 200 is an open collector terminal 204 which corresponds to node 108 of FIG. 3. Terminal 204 is connected to a digital output terminal 205 among a plurality of digital output terminals on a printed wiring board, or on a test fixture. A pull-up resistor 206 is coupled to each output terminal 205. A detector 210 also has an open collector output 211 connected to the node 205. The input to the detector 210 is connected across load resistor 214 and capacitor 212 to transmission line at test point 213 in the receiver circuitry of the RF circuit. The supply on the transmit side represented by $VCC_{TX}$ at node 220 is powered up for testing of the transmitter circuitry using detector 200, while the supply $VCC_{RX}$ at node 221 is powered down. $VCC_{DIG}$ at node 222 is always enabled during this process. To test the receiver circuitry, $VCC_{TX}$ at node 220 is powered down and the supply $VCC_{RX}$ at node 221 is powered up. Thus two detectors 200 and 210 share a test terminal 205 on the printed wiring board, saving space and providing for efficient testing configurations.

Figure 7:
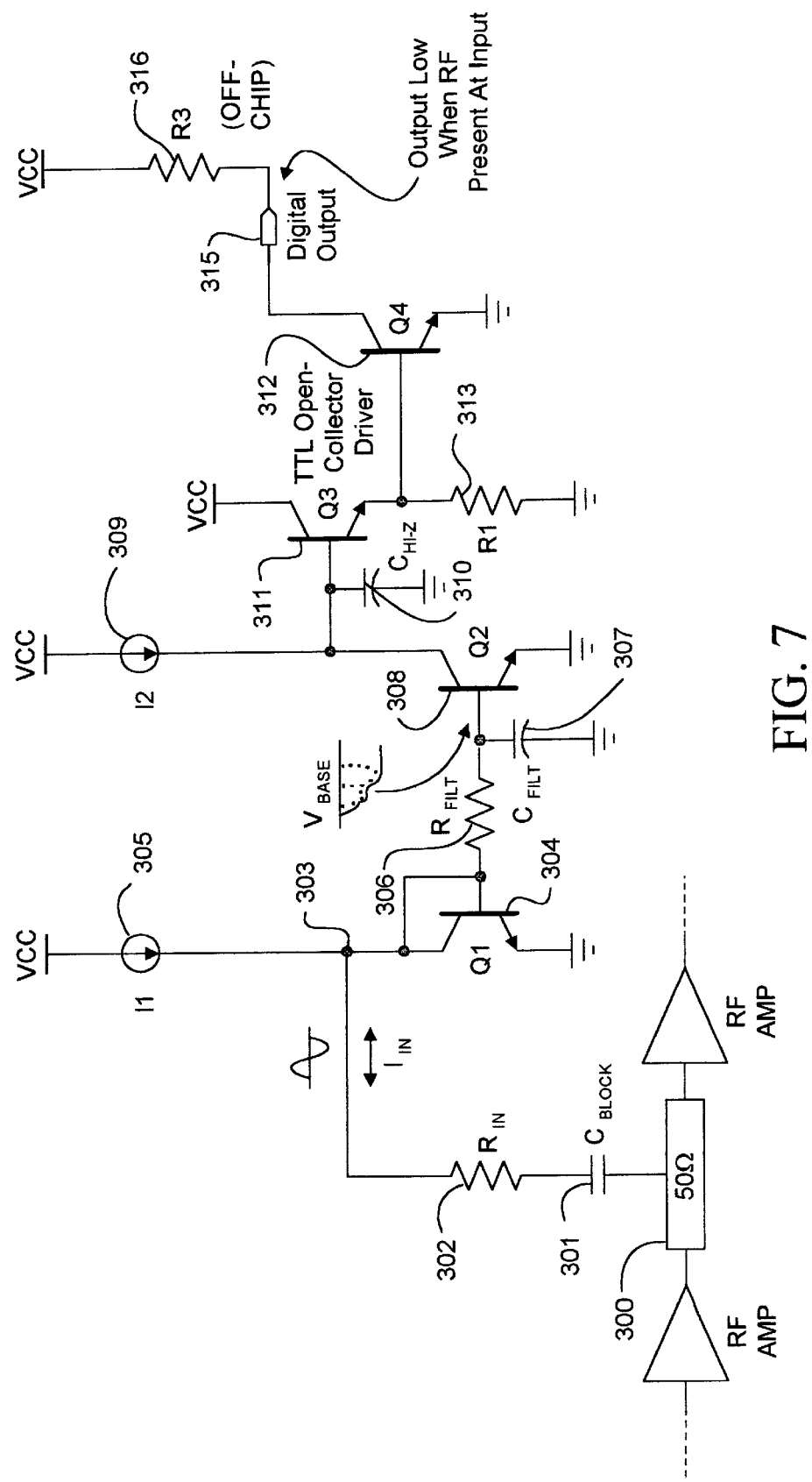
FIG. 7 is a simplified schematic diagram of an alternative embodiment of the RF detector according to the present invention.

FIG. 7 illustrates an alternative embodiment of a RF detector according to the present invention. According to the embodiment of FIG. 7, a RF input is sensed on a transmission line test point 300. A blocking capacitor 301 and a resistor 302 are coupled between the transmission line 300 and an input 303 of the detector circuit. Input 303 is connected to the collector of diode connected transistor 304 which has its emitter connected to ground and its base connected to its collector. Constant current source 305 is coupled to the collector of transistor 304. A RC filter comprising resistor 306 and capacitor 307 is coupled to the base of transistor 304 and provides a low pass filter function. A first terminal of the resistor 306 is connected to the base of transistor 304, and a second terminal of the resistor 306 is connected to a first terminal of the capacitor 307. The second terminal of the capacitor 307 is connected to ground. A current mode amplifier transistor 308 has its base connected to the first terminal of the capacitor 307, its emitter connected to ground, and its collector connected to a constant current source 309 which matches the current source 305. A capacitor 310 is connected across the collector of transistor 308 to ground. Because the node at the collector of transistor 308 is high impedance, the capacitor 310 can be relatively small. Also, a binary output driver comprising transistors 311 and 312 is connected to the collector of transistor 308. Transistor 311 has its emitter connected across a resistor 313 to ground, and its base connected to the collector of transistor 308. The collector of transistor 311 is connected to the supply potential. Transistor 312 has its base connected to the emitter of transistor 311 in a Darlington configuration, and its emitter connected to ground. The collector of transistor 312 is the open collector output at node 315 of the circuit. An off chip pull-up resistor 316 is connected to node 315 to provide the digital output which is active low.

When a RF signal is present at the input 303, the DC operating point of transistor 304 drops because the base-emitter voltage gets smaller. The low pass filter formed by the resistor 306 and the capacitor 307 removes the RF signal component from the base of transistor 304, and biases the base of transistor 308 with the DC voltage equal to the base-emmitter voltage of transistor 304. This modulates current to flow into the base of transistor 308, controlling current at the collector of transistor 308. When the current into collector 308 falls, current from source 309 is diverted to the base of transistor 311, turning on transistor 311 and driving the output of transistor 312 low. Thus, the circuit of FIG. 7 includes a detector based on transistor 304, a current mode amplifier based on the filter including resistor 306 and capacitor 307, and transistor 308, and a binary output driver. The rectifying action of transistor 304 provides half wave rectifying action, allowing lower internal frequency for the circuit than the full wave rectifying circuit of FIGS. 3 and 4. However, at lower frequencies, for example lower than 100 MHz, the embodiment of FIGS. 3 and 4 appears to be more sensitive.

Figure 8:
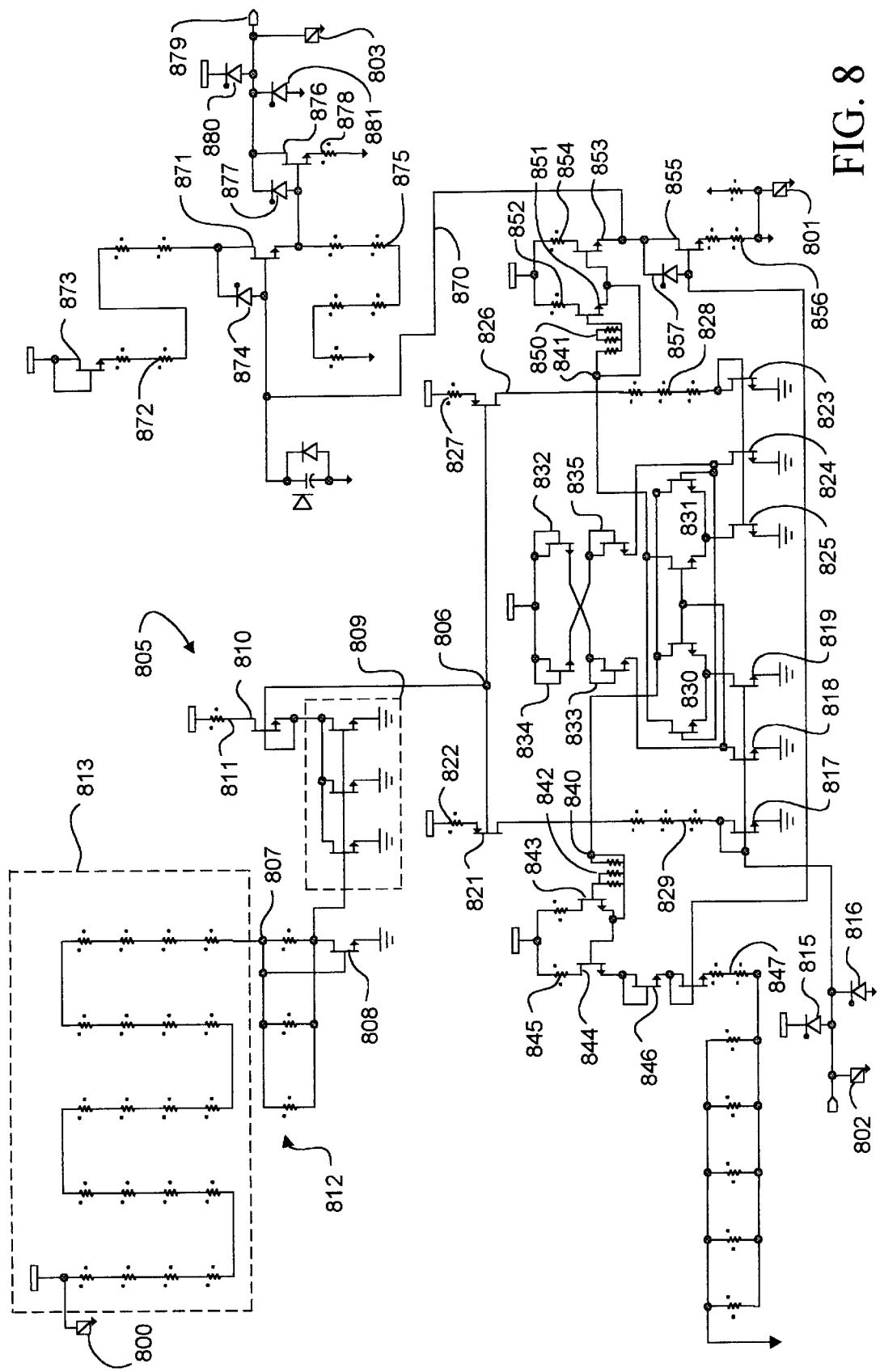
FIG. 8 is a more detailed schematic diagram of an integrated circuit RF detector according to the embodiment of FIGS. 3 and 4 of the present invention.

FIG. 8 is a more detailed schematic diagram of the first embodiment of the present invention, designed for implementation on a single integrated circuit having four I/O pads. Thus, in FIG. 8, the integrated circuit has a first pad 800, a second pad 801, a third pad 802, and a fourth pad 803. The first pad 800 is connected to the supply potential VCC. The second pad 801 is connected to ground. The third pad 802 is connected to the signal input. The fourth pad 803 is connected to the output.

The integrated circuit includes a compensated bias circuit generally 805 which produces a bias voltage at node 806 of about 3.87 volts. The bias circuit 805 includes a set 813 of 20 series connected 3.3 kiloOhm resistors between the power supply pad 800 and node 807. Node 807 is connected to the base of transistor 808. Also, node 807 is connected through a set 812 of three parallel 1.65 kiloOhm resistors having an equivalent resistance of about 550 Ohms, to the collector transistor 808. The emitter transistor 808 is connected to ground. The collector of transistor 808 is also connected to the base of a set 809 of three parallel transistors. The base of the three transistors in set 809 is connected in common to the collector of transistor 808. The collectors of the three transistors in set 809 are connected to the collector of transistor 810, and to the base of transistor 810. The emitter of transistor 810 is connected through a load resistor 811 to the supply terminal. The emitters of the three transistors in set 809 are connected to ground. The bias terminal 806 is taken at the base of transistor 810. The bias circuit has very little sensitivity to power supply variation. Also, the current through transistors 809 increases with temperature, and causes greater high frequency, high temperature performance.

The input terminal 802 is coupled to electrostatic discharge protection diodes 815 and 816. Also, the terminal 802 is connected to the base of transistors 817, 818 and 819 which correspond to the transistors 121, 122 and 129 of FIG. 3.

The constant current source 140 of FIG. 3 is implemented with 12 kiloOhm resistor 820, current source transistor 821 having its base connected to the bias node 806, and 4 kiloOhm load resistor 822.

The reference current mirror circuit is composed of transistors 823 and 824. Also transistor 825 has its base connected to the base of the transistors 824 and 823. These transistors correspond to transistors 123, 124, and 130 of FIG. 3. The current source 143 is implemented with the PNP current source transistor 826 having a 4 kiloOhm load resistor 827 on its emitter, its base connected to the bias point 806, and its collector connected through 12 kiloOhm series resistors 828 to the collector of transistor 823.

The first differential pair of transistors 830 and the second differential pair of transistors 831 are coupled to the transistors 819 and 825 in a manner such as described with respect to FIG. 3. The non-linear loads (corresponding to diodes 141 and 142) on transistor 818 include diode connected transistors 832 and 833. Non-linear load on transistor 824 is based on diode connected transistors 834 and 835. The cross coupling in the FIG. 8 illustrates that the layout of the load diodes is intertwined to compensate for variations in temperature and process variations on the chip to better match the non-linear loads.

The current outputs of the differential pairs 830 and 831 include nodes 840 and 841, which correspond to nodes 150 and 151 of FIG. 3. Node 840 is connected across 12 kiloOhm resistor 842 to the base of transistor 843, and directly to the collector of transistor 843. The emitter of transistor 843 is connected through a 4 kiloOhm load resistor to the supply potential. The collector of transistor 843 is connected to the base of transistor 844, having its emitter connected through a 4 kiloOhm resistor 845 to the supply potential. The collector of transistor 844 is connected to the series 846 of two transistors, each connected in diode configuration. Thus, the collectors and bases of the series transistors 846 are connected together, and the emitter of the first transistor is connected to the base and collector of the second transistor. Second transistor in the pair 846 is connected across a resistive load 847 to the ground terminal. The resistive load includes two 2 kiloOhm resistors in series, and a set of five parallel 1 kiloOhm resistors for an equivalent resistance of about 4200 Ohms.

Node 841 is connected across 12 kiloOhm resistor 850 to the base of transistor 851. The emitter of transistor 851 is connected across a 4 kiloOhm load resistor 852 to the supply potential. The collector of transistor 851 is connected to node 841. Also the collector of transistor 851 is connected to the base of transistor 853. The emitter of transistor 853 is connected across a 4 kiloOhm resistor 854 to the supply potential. The collector of transistor 853 is also connected to the collector of transistor 855 which has its emitter connected across 4 kiloOhm load resistor 856 to the ground pad 801. Also a diode 857 is connected from the base of transistor 855 to the collector of transistor 855. Thus, the resistor on emitter of transistor 855 is slightly smaller than the resistor on the emitter of the second transistor 846. This ensures that the steady state current at node 841 is slightly higher than that at node 840, increasing the turn on threshold for the output to provide some safety in the operation of the current differencing circuit, and ensuring that false signals are not generated when there is no input.

As shown in the figure, the base of transistor 855 is connected to the base of the transistor 846 so that the current differencing circuits are cross coupled as described with reference to FIG. 4 (these transistors corresponding to transistors 161 and 164 of FIG. 4).

The binary output driver shown in FIG. 8 is connected across line 870 to the collector of transistor 853. Line 870 is connected to the base of transistor 871 which has its collector connected across 16 kiloOhm resistor 872 to a diode connected transistor 873. The base of transistor 871 is connected to the anode of Schottky diode 874. The cathode of diode 874 is connected to the collector of transistor 871. The emitter of transistor 871 is connected across 20 kiloOhm resistor 875 to ground. Also, the emitter of transistor 871 is connected to the base of transistor 876. The base of transistor 876 is connected to the anode of Schottky diode 877. The cathode of diode 877 is connected to the collector of transistor 876. The emitter of transistor 876 is connected across a 50 Ohm resistor 878 to ground. The collector of transistor 876 provides an open collector output on node 879. Diodes 880 and 881 provide electrostatic discharge protection at node 879.

The circuit of FIG. 8 consumes about 670 microamps of power at a supply potential of about 5 volts, and dissipates about 3.4 milliwatts of energy. The circuits can run down to 3 volts supply, with even less power dissipation.

Figure 9:
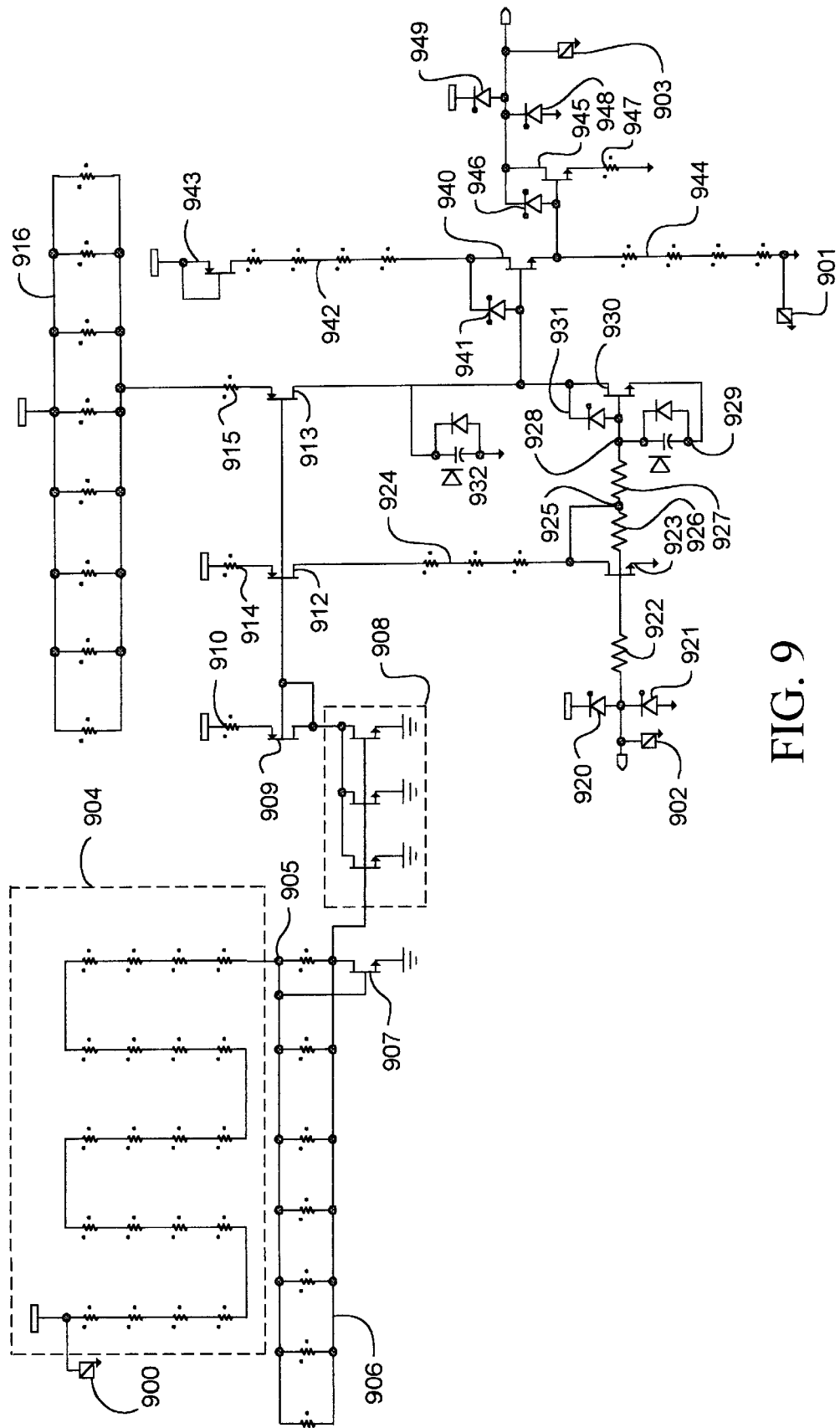
FIG. 9 is a more detailed schematic diagram of an integrated circuit RF detector according to the embodiment of FIG. 7 of the present invention.

FIG. 9 is a detailed schematic diagram of an alternative embodiment of the present invention designed for implementation on integrated circuit. This embodiment corresponds to the embodiment described with respect to FIG. 7.

The circuit of FIG. 9 is implemented on a single integrated circuit having four I/O pads 900–903. Pad 900 is for connection to the power supply VCC. Pad 901 is for connection to ground. Pad 902 is for connection to the signal input. Pad 903 is for connection to the output.

The detector circuit of FIG. 9 includes a bias circuit which comprises series resistors 904 which provide about 66 kiloOhms of resistance between the supply potential 900 and node 905. Node 905 is connected through parallel resistors 906, which provide about 550 Ohms of resistance, to the collector of transistor 907. The base of transistor 907 is connected to node 905. The emitter of transistor 907 is connected to ground. The collector of transistor 907 is connected to the bases of a set 908 of three parallel transistors. The emitters of the transistors in set 908 are connected to ground. The collectors of transistors 908 are connected in common to the collector of transistor 909. The emitter of transistor 909 is connected through 4 kiloOhm transistor 910 to the supply potential. The base of transistor 909 and its collector are connected in common to node 911. Node 911 is connected to the base of current source transistor 912, and to the base of current source transistor 913. The emitter of transistor 912 is connected through 4 kiloOhm resistor to the supply potential. The emitter of transistor 913 is connected to a 4 kiloOhm resistor 915, plus a set 916 of parallel resistors which provide about 500 Ohms resistance, for a total of 4500 Ohms between the emitter of transistor 913 and the supply potential.

Pad 902 is connected to electrostatic discharge diodes 920 and 921 and across on chip 500 Ohm input resistor 922 to the base of transistor 923. The emitter of transistor 923 is connected to ground, the collector of transistor 923 is connected through a 12 kiloOhm resistor 924 to the collector of transistor 912. Also the collector of transistor 923 is connected to node 925. Node 925 is connected across a 4 kiloOhm resistor 926 to the base of transistor 923. Node 925 is also connected across a 4 kiloOhm resistor 927 to node 928. A capacitor 929 is connected between node 928 and ground. Also node 928 is connected to the base of transistor 930. Schottky diode 931 is connected between the base of transistor 930 and the collector of transistor 930. The collector of transistor 930 is also connected to the collector of transistor 913. Similarly, a capacitor 932 is connected from the collector of transistor 930 to ground. The collector of transistor 930 is connected to an open collector output driver. Thus the collector of transistor 930 is connected to the base of transistor 940. A Schottky diode 941 is connected from the base of transistor 940 to its collector. 16 kiloOhm resistor 942 is connected between the collector of transistor 940 and the emitter of transistor 943. The base and collector of transistor 943 are connected in common to the supply potential. The emitter of transistor 940 is connected across 20 kiloOhm resistor 944 to ground at pad 901. The emitter of transistor 940 is connected to the base of transistor 945. A Schottky diode 946 is connected between the base and collector of transistor 945. The emitter of transistor 945 is connected through a 50 Ohm resistor 947 to ground. The collector of transistor 945 is connected to the open collector output at pad 904. Electrostatic discharge diodes 948 and 949 are also connected to the collector of transistor 945.

The circuit of FIG. 9 dissipates about 1.4 micro watts of energy and consumes up to 280 milliamps of current at a supply potential of 5 volts. Also, the circuits can run at 3 volt supply potential, for even better power saving.

Accordingly, the present invention provides a low power, small RF detector suitable for use in the manufacturing and testing of high frequency circuitry, such as transmitters and receivers of RF signals. The detector has a high input impedance relative to the transmission line impedance at the test points in the circuit under test, over a very broad range of frequencies so as to minimally load the circuit. Furthermore, this detector is AC coupled to the circuit under test so that it does not upset the bias conditions. The circuit is physically small, so it fits in a compact 4 pin package which can be used on a printed wiring board of a RF circuit without requiring substantial additional board space. This allows the detector to be incorporated into the manufacturing process, and left in place during commercial use of products at a low cost and with high efficiency. Furthermore, because of the very low power consumed, it is acceptable to allow power to be applied to the detector circuit, even while it is not being used for testing.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An alternating current (AC) detector for detecting the presence of AC signals on a transmission line of a circuit board having a transmission line impedance, comprising:
    an element having an impedance higher than said transmission line impedance of said circuit board providing a detector input;
    a current mode detector coupled to the input, which translates AC signals input to a bias signal having a DC component determined by strength of the AC signal on the transmission line;
    a current mode amplifier, coupled to the current mode detector, which amplifies the bias signal to produce a detector current; and
    a binary output driver, coupled to the current mode amplifier, which generates a binary signal having one binary level if the detector current exceeds a high signal threshold, and another binary level if the detector current falls below a low signal threshold.

2. The detector of claim 1, wherein the high signal threshold and the low signal threshold are about the same.

3. An alternating current (AC) detector for detecting the presence of AC signals on a transmission line having a transmission line impedance, comprising:
    a detector input, for connection to the transmission line through an impedance higher than the transmission line impedance;
    a current mode detector coupled to the input, which translates AC signals on the detector input to a bias signal having a DC component determined by strength of the AC signal on the transmission line;
    a current mode amplifier, coupled to the current mode detector, which amplifies the bias signal to produce a detector current; and
    a binary output driver, coupled to the current mode amplifiers which generates a binary signal having one binary level if the detector current exceeds a high signal threshold, and another binary level if the detector current falls below a low signal threshold, wherein the high signal threshold and the low signal threshold are different so that hysteresis is established in the circuit.

4. The detector of claim 1, wherein said AC signals have a frequency in a range from near 10 megahertz to over 2.5 gigahertz.

5. The detector of claim 1, wherein said AC signals have a frequency in a range from near 100 megahertz to over 2.5 gigahertz.

6. The detector of claim 1, wherein said AC signals have a frequency in a range from near 100 megahertz to 10 gigahertz.

7. The detector of claim 1, wherein the current mode detector comprises:
    an input current mirror circuit, having
        a diode connected transistor having a bias terminal, a current input terminal and a current output terminal, the bias terminal coupled to the detector input and to the current input terminal, the current input terminal coupled to a constant current source, and the current output terminal coupled to a reference potential, so that current in the diode connected transistor is modulated by the AC signal;
        a mirror connected transistor having a bias terminal, a current input terminal and a current output terminal, the bias terminal coupled to the bias terminal of the diode connected transistor, the current input terminal coupled to a nonlinear load, and the current output terminal coupled to the reference potential so that current in the diode connected transistor is mirrored in the mirror connected transistor; and
    a current mode rectifying circuit coupled to the input current mirror circuit, which rectifies the current in the current mirror circuit.

8. The detector of claim 7, wherein the current mode rectifying circuit comprises a full wave rectifier.

9. The detector of claim 7, wherein the current mode rectifying circuit comprises:
    a reference current mirror circuit having
        a diode connected transistor having a bias terminal, a current input terminal and a current output terminal, the bias terminal coupled to the current input terminal, the current input terminal coupled to a constant current source, and the current output terminal coupled to a reference potential, so that current in the diode connected transistor is substantially constant;
        a mirror connected transistor having a bias terminal, a current input terminal and a current output terminal, the bias terminal coupled to the bias terminal of the diode connected transistor, the current input terminal coupled to a nonlinear load, and the current output terminal coupled to the reference potential so that current in the diode connected transistor is mirrored in the mirror connected transistor;

a first differential pair of transistors, having current output terminals connected in common to a current source transistor connected to mirror current in the mirror connected transistor of the input current mirror circuit, a bias terminal on a first transistor in the first differential pair coupled to the current input terminal of the mirror connected transistor of the input current mirror circuit, a bias terminal on a second transistor in the first differential pair coupled to the current input terminal of the mirror connected transistor of the reference current mirror circuit, a current input terminal on the first transistor of the first differential pair connected to a first rectified output node, and current input terminal on the second transistor of the first differential pair connected to a second rectified output node; and a second differential pair of transistors, having current output terminals connected in common to a current source transistor connected to mirror current in the mirror connected transistor of the reference current mirror circuit, a bias terminal on a first transistor in the second differential pair coupled to the current input terminal of the mirror connected transistor of the input current mirror circuit, a bias terminal on a second transistor in the second differential pair coupled to the current input terminal of the mirror connected transistor of the reference current mirror circuit, a current input terminal on the first transistor of the second differential pair connected to the second rectified output node, and current input terminal on the second transistor of the second differential pair connected to the first rectified output node.

10. The detector of claim 9, wherein the current mode amplifier comprises a current differencing circuit connect to the first and second rectified outputs.

11. The detector of claim 10, wherein the binary output driver comprises an open collector driver, responsive to a difference between current on the first and second rectified outputs.

12. The detector of claim 9, wherein said transistors comprise bipolar transistors in which the bias terminal corresponds to a base, the current output terminal corresponds to a collector and the current input terminal corresponds to an emitter.

13. The detector of claim 1, wherein the current mode detector comprises:

a diode connected transistor having a bias terminal, a current input terminal and a current output terminal, the bias terminal coupled to the current input terminal and to the detector input, the current input terminal coupled to a constant current source, and the current output terminal coupled to a reference potential, so that current due to the AC signal on the bias terminal of the diode connected transistor is rectified;

a filter comprising a resistor and a capacitor, the resistor having one terminal coupled to the bias terminal of the diode connected transistor and a second terminal connected to a first terminal of the capacitor, the second terminal of the capacitor connected to a reference potential, so that current on the bias terminal of the diode connected transistor is averaged at the first terminal to the capacitor; and wherein the current mode amplifier comprises
a transistor having a bias terminal, a current input terminal and a current output terminal, the bias terminal coupled to the first terminal of the capacitor, the current input terminal coupled to a constant current source which matches the constant current source coupled to the current output terminal of the diode connected transistor, and the current output terminal is coupled to the reference potential so that current in the transistor is modulated in response to power of the AC signal.

14. The detector of claim 13, wherein the binary output driver comprises an open collector driver, responsive to current on the current input terminal of the transistor in the current mode amplifier.

15. The detector of claim 13, wherein said transistors comprise bipolar transistors in which the bias terminal corresponds to a base, the current output terminal corresponds to a collector and the current input terminal corresponds to an emitter.

16. The detector of claim 1, wherein said current mode detector, said current mode amplifier, and said binary output driver, comprise elements of a single integrated circuit.

17. The detector of claim 9, wherein said current mode detector, said current mode amplifier, and said binary output driver, comprise elements of a single integrated circuit.

18. The detector of claim 13, wherein said current mode detector, said current mode amplifier, and said binary output driver, comprise elements of a single integrated circuit.

19. An apparatus for testing a radio frequency RF circuit having a plurality of test points at which RF signals are present during normal operation, comprising:

a plurality of integrated circuit RF detectors, one integrated circuit RF detector in said plurality of integrated circuit RF detectors coupled to a corresponding test point in said plurality of test points, and comprising
an input, for connection to the corresponding test point;
a current mode detector coupled to the input, which translates an RF signal on the input to a bias signal having a DC component determined by power of the RF signal on the transmission line;
a current mode amplifier, coupled to the current mode detector, which amplifies the bias signal to produce a detector current; and
a binary output driver, coupled to the current mode amplifier, which generates binary signal having one binary level if the detector current exceeds a high signal threshold, and another binary level if the detector current falls below a low signal threshold.

20. The apparatus of claim 19, wherein said one integrated circuit includes four pins, one pin coupled to a power supply, one pin coupled to a reference potential, one pin coupled to the input and one pin coupled to the binary signal generated by the binary output driver.

21. The apparatus of claim 19, including a plurality of test terminals coupled to the plurality of integrated circuit RF detectors, and wherein the binary output driver comprises an open collector output driver coupled to one of the plurality of test terminals.

22. The apparatus of claim 19, wherein more than one integrated circuit RF detector has an output coupled to a single test terminal.

23. The apparatus of claim 19, wherein said RF circuit is mounted on a printed wiring board, and the plurality of integrated circuit RF detectors is mounted on the printed wiring board.

24. An alternating current (AC) detector for detecting the presence of AC signals on a transmission line having a transmission line impedance, comprising:

a detector input, for connection to the transmission line through an impedance higher than the transmission line impedance;

a current mode detector including an input current mirror circuit, having a diode connected transistor having a bias terminal, a current input terminal and a current output terminal, the bias terminal coupled to the detector input and to the current input terminal, the current input terminal coupled to a constant current source, and the current output terminal coupled to a reference potential, so that current in the diode connected transistor is modulated by the AC signal;

a mirror connected transistor having a bias terminal, a current input terminal and a current output terminal, the bias terminal coupled to the bias terminal of the diode connected transistor, the current input terminal coupled to a nonlinear load, and the current output terminal coupled to the reference potential so that current in the diode connected transistor is mirrored in the mirror connected transistor; and a current mode rectifying circuit coupled to the input current mirror circuit, which rectifies the current in the current mirror circuit, including a reference current mirror circuit having a diode connected transistor having a bias terminal, a current input terminal and a current output terminal, the bias terminal coupled to the current input terminal, the current input terminal coupled to a constant current source, and the current output terminal coupled to a reference potential, so that current in the diode connected transistor is substantially constant, and a mirror connected transistor having a bias terminal, a current input terminal and a current output terminal, the bias terminal coupled to the bias terminal of the diode connected transistor, the current input terminal coupled to a nonlinear load, and the current output terminal coupled to the reference potential so that current in the diode connected transistor is mirrored in the mirror connected transistor;

a first differential pair of transistors, having current output terminals connected in common to a current source transistor connected to mirror current in the mirror connected transistor of the input current mirror circuit, a bias terminal on a first transistor in the first differential pair coupled to the current input terminal of the mirror connected transistor of the input current mirror circuit, a bias terminal on a second transistor in the first differential pair coupled to the current input terminal of the mirror connected transistor of the reference current mirror circuit, a current input terminal on the first transistor of the first differential pair connected to a first rectified output node, and current input terminal on the second transistor of the first differential pair connected to a second rectified output node; and a second differential pair of transistors, having current output terminals connected in common to a current source transistor connected to mirror current in the mirror connected transistor of the reference current mirror circuit, a bias terminal on a first transistor in the second differential pair coupled to the current input terminal of the mirror connected transistor of the input current mirror circuit, a bias terminal on a second transistor in the second differential pair coupled to the current input terminal of the mirror connected transistor of the reference current mirror circuit, a current input terminal on the first transistor of the second differential pair connected to the second rectified output node, and current input terminal on the second transistor of the second differential pair connected to the first rectified output node; and a current differencing circuit connected to the first and second rectified outputs, having an open collector driver, responsive to a difference between current on the first and second rectified outputs.

25. An alternating current (AC) detector for detecting the presence of AC signals on a transmission line having a transmission line impedance, comprising:

an input, for connection to the transmission line through an impedance higher than the transmission line impedance;

a diode connected transistor having a bias terminal, a current input terminal and a current output terminal, the bias terminal coupled to the current input terminal and to the input, the current input terminal coupled to a constant current source, and the current output terminal coupled to a reference potential, so that current due to the AC signal on the bias terminal of the diode connected transistor is rectified;

a filter comprising a resistor and a capacitor, the resistor having one terminal coupled to the bias terminal of the diode connected transistor and a second terminal connected to a first terminal of the capacitor, the second terminal of the capacitor connected to a reference potential, so that current on the bias terminal of the diode connected transistor is averaged at the first terminal to the capacitor;

an amplifying transistor having a bias terminal, a current input terminal and a current output terminal, the bias terminal coupled to the first terminal of the capacitor, the current input terminal coupled to a constant current source which matches the constant current source coupled to the current output terminal of the diode connected transistor, and the current output terminal is coupled to the reference potential so that current in the amplifying transistor is modulated in response to power of the AC signal; and a binary output driver, coupled to the current output terminal of the amplifying transistor, which generates binary signal having one binary level if the current in the amplifying transistor exceeds a high signal threshold, and another binary level if the detector current falls below a low signal threshold.

* * * * *